United States Patent
Deokar et al.

(10) Patent No.: US 10,700,513 B2
(45) Date of Patent: Jun. 30, 2020

(54) SYSTEMS AND METHODS OF COMMISSIONING ENERGY STORAGE SYSTEMS (ESS)

(71) Applicant: SCHNEIDER ELECTRIC IT CORPORATION, West Kingston, RI (US)

(72) Inventors: Vishwas Mohaniraj Deokar, Acton, MA (US); Eyob Demissie, Lowell, MA (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 116 days.

(21) Appl. No.: 15/897,695

(22) Filed: Feb. 15, 2018

(65) Prior Publication Data

US 2018/0226790 A1 Aug. 9, 2018

Related U.S. Application Data

(60) Provisional application No. 62/454,366, filed on Feb. 3, 2017.

(51) Int. Cl.
*H02H 7/22* (2006.01)
*H02J 3/32* (2006.01)
*H02H 1/00* (2006.01)
*G01R 31/68* (2020.01)
*H02J 13/00* (2006.01)
*H02J 7/00* (2006.01)
*H02J 3/00* (2006.01)
*H01M 10/42* (2006.01)

(52) U.S. Cl.
CPC ............ *H02H 7/222* (2013.01); *G01R 31/68* (2020.01); *H02H 1/0007* (2013.01); *H02J 3/32* (2013.01);

(Continued)

(58) Field of Classification Search
CPC .... H02H 7/222; H02H 1/0007; G01R 31/043; H02J 3/32; H02J 7/0068; H02J 13/0006;
(Continued)

(56) References Cited

U.S. PATENT DOCUMENTS

2016/0006052 A1 1/2016 Li et al.
2017/0005371 A1 1/2017 Chidester et al.
(Continued)

FOREIGN PATENT DOCUMENTS

DE 102012215190 A1 2/2014
DE 102015002077 B3 6/2016
(Continued)

OTHER PUBLICATIONS

Extended European Search Report from corresponding European Application No. 18153984.2 dated Jun. 29, 2018.

*Primary Examiner* — Hal Kaplan
(74) *Attorney, Agent, or Firm* — Lando & Anastasi, LLP

(57) ABSTRACT

Systems and methods for commissioning an energy storage system are disclosed. An example method for commissioning an ESS may include connecting a first energy storage system to an battery module, energizing, by the first energy storage system, the battery module, articulating one or more battery contactors within the first energy storage system to selectively couple the battery module to a power source, processing a battery contactor status of the one or more battery contactors to detect battery contactor errors, disengaging, responsive to not detecting any battery contactor errors, the battery module at the first energy storage system, and determining a status of the energy storage system.

20 Claims, 14 Drawing Sheets

(52) U.S. Cl.
CPC ............... *H01M 10/42* (2013.01); *H02J 3/00* (2013.01); *H02J 3/001* (2020.01); *H02J 7/0026* (2013.01); *H02J 7/0068* (2013.01); *H02J 13/0006* (2013.01); *Y02E 60/722* (2013.01); *Y02E 60/725* (2013.01); *Y04S 10/14* (2013.01); *Y04S 10/20* (2013.01)

(58) Field of Classification Search
CPC ........ H02J 2003/001; H02J 3/00; H02J 3/001; H02J 7/0026; H01M 10/42; Y02E 60/722; Y02E 60/725; Y04S 10/14; Y04S 10/20
USPC .......................................................... 307/23
See application file for complete search history.

(56) References Cited

U.S. PATENT DOCUMENTS

2018/0026255 A1   1/2018   Hellenthal et al.
2018/0034035 A1   2/2018   Hinterberger et al.

FOREIGN PATENT DOCUMENTS

WO       2016131806 A1    8/2016
WO       2017004078 A1    1/2017

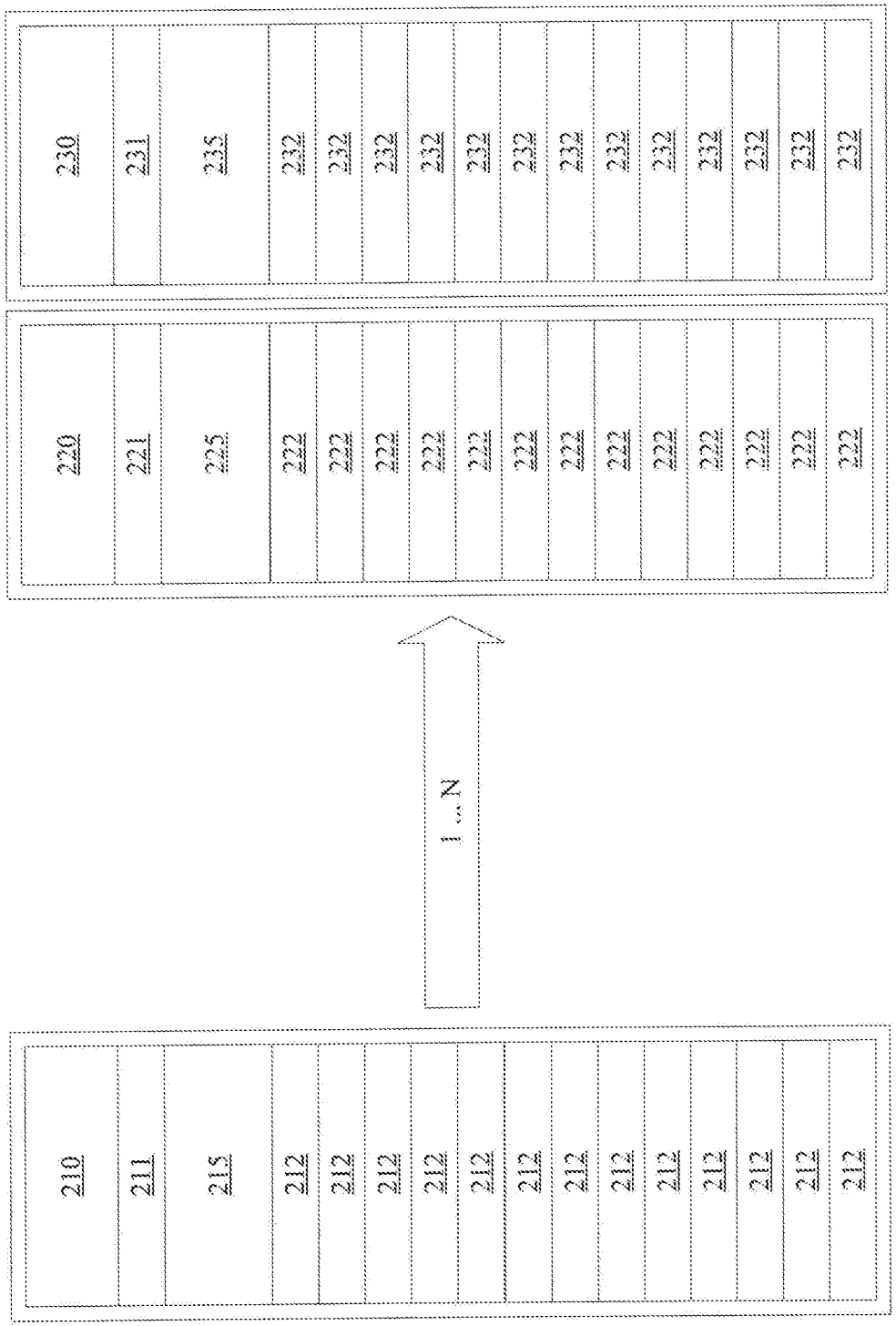

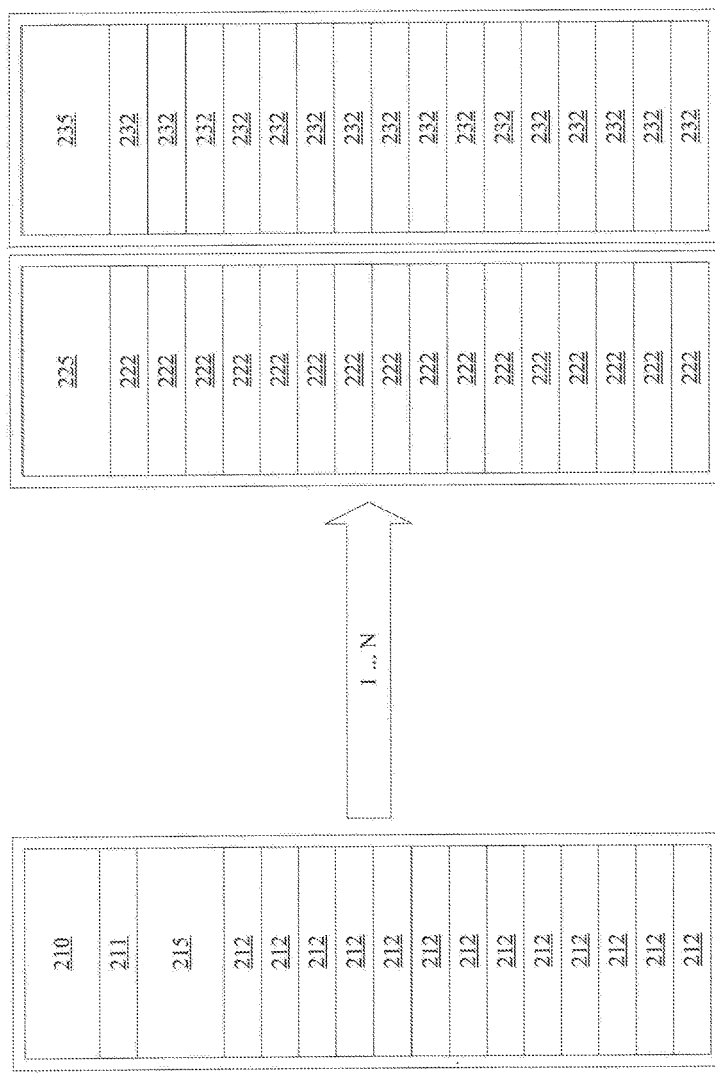

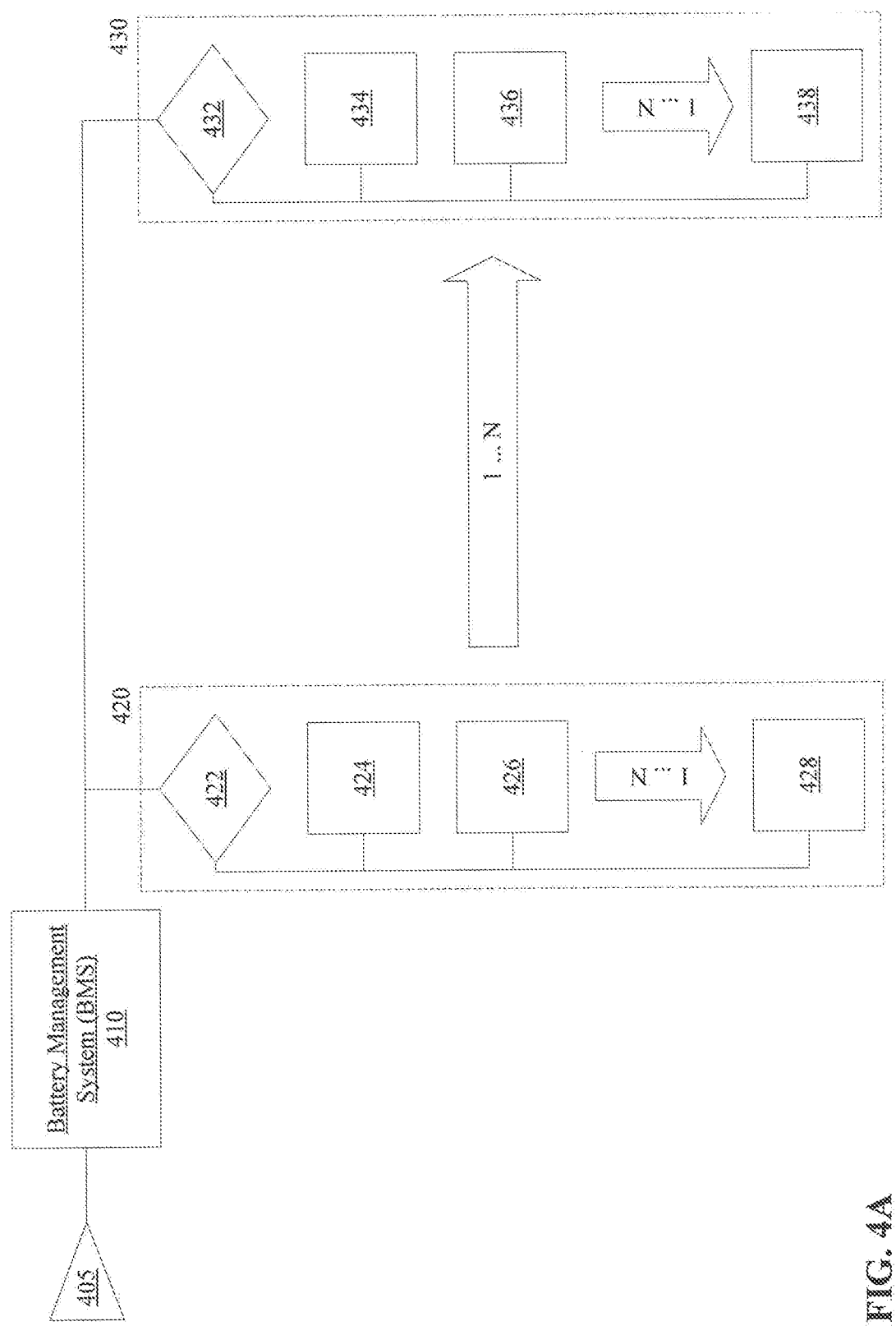

SYSTEMS AND METHODS OF COMMISSIONING ENERGY STORAGE SYSTEMS (ESS)

CROSS-REFERENCE TO RELATED APPLICATION

This application claims priority under 35 U.S.C. § 119(e) to U.S. Provisional Application Ser. No. 62/454,366, titled "SYSTEMS AND METHODS OF COMMISSIONING ENERGY STORAGE SYSTEMS (ESS)," filed on Feb. 3, 2017, which is hereby incorporated by reference in its entirety.

BACKGROUND

Field of the Invention

Embodiments of the present disclosure relate generally to systems and methods of commissioning electro-mechanical systems, and more specifically to systems and methods for commissioning Energy Storage Systems (ESS).

Description of the Related Art

Energy storage captures energy at one point in time for use at a later point in time. Energy Storage Systems (ESS) are the systems and methods used to accomplish the capture, conversion, storage, regulation, and/or distribution of energy at that later point in time. Such systems have wide applicability ranging from the very small to the very large in residential, commercial, industrial, and/or utility applications. Examples of such systems may include energy flow from an electric grid through electrical distribution channels to an ESS. Other alternate energy generation methods are contemplated, such as fuel powered generators, and/or renewable sources such as solar and/or wind sources which, once converted, fuel the ESS. In these cases, to allow stored energy to be available at a later time, a scalable, modular, and/or transportable, an energy storage device is highly beneficial.

Any energy storage device to be stored, transported, and operated safely is highly beneficial. To maintain safe storage, transport, commissioning, and/or operation of an ESS and comport with related local, state, national, and international regulation becomes a serious challenge.

SUMMARY

Systems and methods for commissioning an energy storage system (ESS) are disclosed. An example method for commissioning an ESS may comprise, connecting, an energy source to a first energy storage system, engaging a mechanism to energize the energy source connected to the first energy storage system, processing an energy storage system status utilizing a processing unit to detect any system errors, articulating one or more battery contactors within the first energy storage system in response to not detecting any system errors, processing a battery contactor status of the one or more battery contactors utilizing the processing unit to detect any battery contactor errors, disengaging the energy source at the first energy storage system in response to not detecting any battery contactor errors, determining an overall status of the energy storage system, and transmitting the overall status of the energy storage system to the processing unit in response to the overall status indicating absence of system errors.

In another embodiment, a subordinate energy storage system may be coupled to the first storage system, where the first and all subordinate energy storage systems form an energy storage system zone.

Another embodiment of powering up an energy storage system (ESS), may comprise, transmitting energy from the first energy storage system to a subordinate energy storage system, processing an energy storage system status of the subordinate energy storage system utilizing a processing unit of the subordinate energy storage system, articulating one or more battery contactors within the subordinate energy storage system, processing a battery contactor status of the one or more battery contactors within the subordinate energy storage system utilizing the processing unit, determining a status of a plurality of energy storage systems, and transmitting the status of the plurality of energy storage systems to the processing unit of the first energy storage system.

Another embodiment of powering up an energy storage system (ESS) may comprise, engaging an energy source to a first ESS to cause an operational state of the first ESS to change from a non-operational state to a partially operational state, utilizing a system status of the first ESS in the partially operational state to detect any system errors, in the absence of any system errors, actuating one or more battery contactors within the first ESS cause the operational state of the first ESS to change from the partially operational state to a fully operational state, and disengaging the energy source from the first ESS that is in the fully operational state.

Another embodiment of powering up an energy storage system (ESS) may comprise, disengaging the energy source from the first ESS when a battery contactor status indicates no battery contactor errors.

Principles of the disclosure also contemplate determining an overall status of the first ESS in the fully operational state, the overall status indicating presence or absence of one or more system errors. Further when no system errors are detected, transmitting the overall status of the first ESS to a processing unit. Further transmitting energy from the first ESS in the fully operational state to a subordinate ESS to cause an operational state of the subordinate ESS to change from a non-operational state to a fully operational state.

In one embodiment, a method of commissioning an energy storage system is provided. The method includes acts of connecting a first energy storage system to an battery module, energizing, by the first energy storage system, the battery module, articulating one or more battery contactors within the first energy storage system to selectively couple the battery module to a power source, processing a battery contactor status of the one or more battery contactors to detect battery contactor errors, disengaging, responsive to not detecting any battery contactor errors, the battery module at the first energy storage system, and determining a status of the energy storage system.

In at least one embodiment, the method further includes processing an energy storage system status to detect one or more system errors. In some embodiments, the method further includes correcting, autonomously in response to detecting the one or more system errors, the one or more system errors. In one embodiment, correcting the one or more system errors includes commanding, autonomously in response to detecting the one or more system errors, a circuit breaker in the first energy storage system to reset.

In an embodiment, the method further includes prompting, in response to detecting the one or more system errors, a user to manually correct the one or more system errors. In at least one embodiment, articulating the one or more battery contactors within the first energy storage system is performed responsive to not detecting one or more system errors. In some embodiments, processing the battery contactor status of the one or more battery contactors to detect one or more battery contactor errors includes detecting at least one stuck battery contactor. In at least one embodiment, the method further includes commanding, autonomously in response to detecting the at least one stuck battery contactor, the at least one stuck battery contactor to reset. In some embodiments, the method includes prompting, in response to detecting the at least one stuck battery contactor, a user to manually correct the at least one stuck battery contactor. In one embodiment, energizing the battery module includes engaging a mechanism to couple the battery module to the first energy storage system.

In one embodiment, engaging the mechanism includes engaging one of a switch, a relay, a contact, and a keyway. In at least one embodiment, the method includes transmitting energy from the first energy storage system to a subordinate energy storage system, processing an energy storage system status of the subordinate energy storage system utilizing a processing unit of the subordinate energy storage system, articulating one or more battery contactors within the subordinate energy storage system, processing a battery contactor status of the one or more battery contactors within the subordinate energy storage system utilizing the processing unit, determining a status of a plurality of energy storage systems, and transmitting the status of the plurality of energy storage systems to the processing unit of the first energy storage system.

According to one aspect of the disclosure, an energy storage system is provided. The energy storage system includes at least one contactor configured to be coupled to at least one corresponding battery module, a power conversion module configured to be coupled to a power source at a first connection and the at least one battery module at a second connection, and a battery management system configured to be coupled to the at least one contactor and the power conversion module. The battery management system is configured to energize the at least one battery module, articulate the at least one contactor, process a contactor status of the at least one contactor to detect contactor errors, disengage the at least one battery module responsive to not detecting any battery contactor errors, and determine a status of the energy storage system.

In one embodiment, the battery management system is further configured to process an energy storage system status to detect one or more system errors. In some embodiments, the battery management system is further configured to correct, autonomously in response to detecting the one or more system errors, the one or more system errors. In at least one embodiment, the system includes a circuit breaker, wherein the battery management system is further configured to command, autonomously in response to detecting the one or more system errors, the circuit breaker to reset.

In at least one embodiment, the battery management system is further configured to articulate the at least one contactor responsive to not detecting one or more system errors. In some embodiments, processing the contactor status includes detecting at least one stuck battery contactor. In one embodiment, the battery management system is further configured to command, autonomously in response to detecting the at least one stuck battery contactor, the at least one stuck battery contactor to reset. In some embodiments, the battery management system is configured to engage a mechanism to couple the at least one battery module to the energy storage system.

In at least one embodiment, the system further includes a system level controller and at least one connection configured to be coupled to a subordinate energy storage system, and wherein the system level controller is configured to transmit energy from the energy storage system to the subordinate energy storage system, process an energy storage system status of the subordinate energy storage system, articulate one or more battery contactors within the subordinate energy storage system, process a battery contactor status of the one or more battery contactors within the subordinate energy storage, and determine a status of a plurality of energy storage systems.

BRIEF DESCRIPTION OF THE DRAWINGS

These accompanying drawings are not intended to be drawn to scale. In the drawings, each identical or nearly identical component that is illustrated in various figures is represented by a line numeral. For purposes of clarity, not every component may be labeled in every drawing. In the drawings:

FIG. 2A illustrates aspects of an Energy Storage Systems (ESS) Zone for commissioning in accordance with various embodiments of this disclosure;

FIG. 2C illustrates aspects of an Energy Storage Systems (ESS) Zone which are Direct Current (DC) based for commissioning in accordance with various embodiments of this disclosure;

FIG. 4A illustrates a block diagram detailing aspects of energy storage strings of an Energy Storage System (ESS) in accordance with various embodiments of this disclosure;

DETAILED DESCRIPTION

Figure 1:
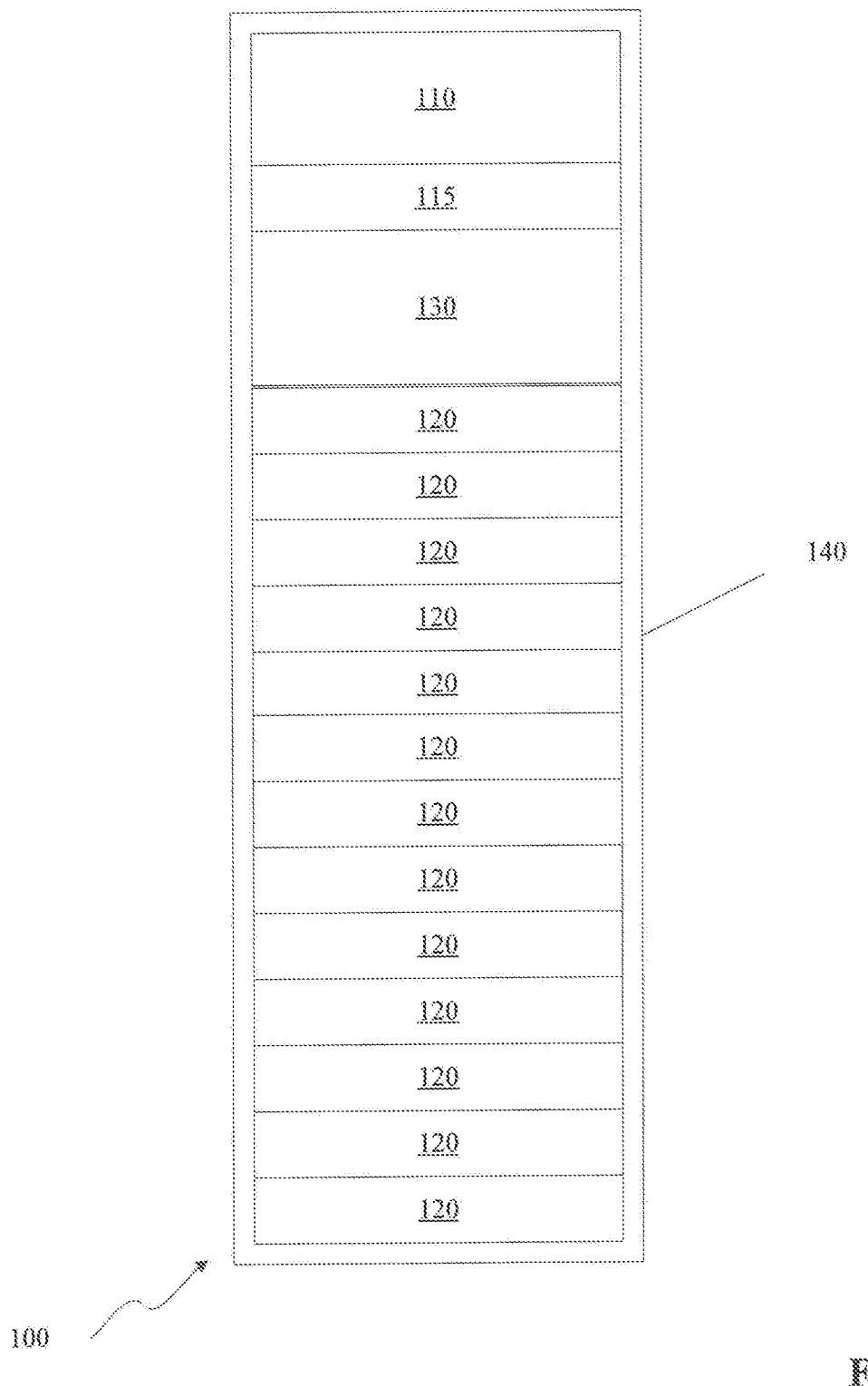
FIG. 1 illustrates aspects of an Energy Storage System (ESS) for commissioning in accordance with various embodiments of this disclosure.

This disclosure is not limited in its application to the details of construction and the arrangement of components set forth in the following descriptions or illustrated by the drawings. The disclosure is capable of other embodiments and of being practiced or of being carried out in various ways. Also, the phraseology and terminology used herein is for the purpose of descriptions and should not be regarded as limiting. The use of "including," "comprising," "having," "containing," "involving," and variations herein, are meant to be open-ended, i.e. "including but not limited to."

Energy Storage Systems (ESS) have a variety of applications to a variety of user groups. While storing energy at one point in time for use at a later point in time is an embodiment of an ESS, other embodiments exist which include, but are not limited to, power frequency regulation, electrical load leveling and peak shaving, emergency power backup, electrical grid stabilization, and/or power quality conditioner. Such embodiments may be deployed in residential, commercial, utility, and/or industrial applications which may benefit each type of environment. To achieve such benefits for such a wide array of applications, it is highly beneficial for any ESS to be modular and scalable.

Energy Storage Systems (ESS) and/or their components may be transportable in nature. If so, local, state, regional, national, and/or international regulatory bodies may require, as one of many examples, rendering an ESS safe for transport through practices, such as, disconnecting any stored energy sources from the remainder of an ESS system. As such there is benefit to systems and methods to allow the safe transport, assembly, and commissioning of an ESS.

An ESS may contain one or more devices which store energy. Examples of an energy storage device may include one or more batteries, capacitors, and/or fuel cells. To render these energy storage elements safe during storage, transport, and/or prior to commissioning of an ESS, these energy sources are electrically isolated through the use of switching elements. It is through the commissioning process that such a system is transformed from a series of inert components, to a functioning ESS. These systems and methods for commissioning an ESS may include the application of an external energy source, as one of many examples, a battery, to energize a first ESS to control one or more battery contactors or stored energy sources to provide energy to a first ESS and any subordinate ESS.

Per regulatory standards (one example being Department of Transportation (DOT) 38.3), lithium-ion battery is required to be transported safely to prevent a fire hazard, explosion, and/or other unsafe condition. One contributor to a fire hazard may be thermal runaway due to a cell/battery short circuit. To substantially reduce the possibility of this situation, the battery cell/pack may be configured with a switch (mechanical or electromechanical) to disconnect a battery cell from the battery pack bus terminals during transportation. Such a switch breaks the path of the energy flow from positive to negative terminal, thereby preventing current flow.

FIG. 1 illustrates aspects of an Energy Storage System (ESS) for commissioning in accordance with various embodiments of this disclosure. Embodiments of an ESS 100 may contain several components to attain the desired benefits for the particular application. Components to the ESS 100 may include a system level controller 110, power conversion module 115, one or more battery modules 120, battery management system 130, none, some, or all of which may be housed in a rack enclosure 140. It should be appreciated while a particular configuration is illustrated in FIG. 1, many alternate system configurations are possible and the particular location of the components may not affect functionality.

For example, the system level controller 110 may be an individual appliance within the rack enclosure 140, or may share a rack unit (as known as "U" spot) with another device such as the power conversion module 115 or any other. Battery modules 120 may vary in shape, size, number, or any other physical characteristic based on a variety of factors that include, but are not limited to, battery type, construction, connection, and/or application. A power conversion module 115 may also vary in size, rack unit or "U" height, or other physical characteristics based on, for example, input power, safety considerations, or application for the ESS as a system. A battery management system 130 may also vary in physicality for reasons detailed herein.

A rack enclosure 140 may be a rack system fabricated from a variety of material such as aluminum, steel, or other material designed to support the weight of the components and may additionally serve as a safety barrier for the components contained therein. Such a rack enclosure 140 may be for example, similar to an IT rack system designed to operate in an indoor environment, or may be hardened to operate in austere environments including, but not limited to, outdoors in a variety of weather conditions, as part of a micro-grid solution, or within a containerized structure, for example a containerized data center, with little or no environmental support.

Other components may be included into an ESS 100 to accommodate particular applications. As examples, an ESS 100 may include specialized components to perform peak shaving and/or load shifting to accommodate emergency backup power scenarios and/or demand response. Other examples may include a micro grid application where equipment may be necessary to create a localized grid capable of disconnecting from the main grid and operate independently when disconnected. Other examples include power products through the integration of renewable sources such as solar or wind energy which may produce large availability swings. Also the near instant charge and/or discharge cycles of grid stabilization applications when frequency regulation, power quality, voltage control, and/or spinning reserves are considerations for additional specialized equipment that may be beneficial to an ESS 100.

When more than one ESS 100 is connected an ESS Zone is formed. Energy storage systems may be combined to allow benefits such as additional capacity of stored energy for the particular application. FIG. 2A illustrates aspects of an Energy Storage Systems (ESS) Zone for commissioning in accordance with various embodiments of this disclosure. While the number and type of components contained within each ESS Zone may vary based on application in a ESS 100, in an ESS Zone, the number of ESS systems may vary based on application. FIG. 2A illustrates an embodiment on the use of a plurality of ESS systems to form an ESS Zone master rack 200, 201, 202 to form an ESS Zone. Each ESS Zone system may have the components detailed above in each discrete system, such as a system level controller module 210, 220, 230, power conversion module 211, 221, 231, battery module 212, 222, 232, and Battery Management System (BMS) 215, 225, 235. Each ESS system may be contained within a rack as detailed above. It should be appreciated this disclosure contemplates any number of ESS, from 1 to N, may be aggregated to form a Zone based on the application. Embodiments of the disclosure also contemplate the connection of multiple ESS Zones.

In various embodiments, the ESS Zone may contain only one system level controller module per Zone. A rack enclosure which contains the only system level controller module for a Zone may be the ESS Zone master rack 200. A BMS module within the ESS Zone master rack 200 may aggregate data from each of the other BMS modules within the ESS Zone. This disclosure contemplates one or more ESS Zone master racks 200 may be configured per ESS Zone. An ESS may be Alternating Current (AC) or Direct Current (DC) based technology and a ESS Zone may be composed of ESS based on AC technology, DC technology, or a mix of both AC and DC based technology.

Figure 2B:
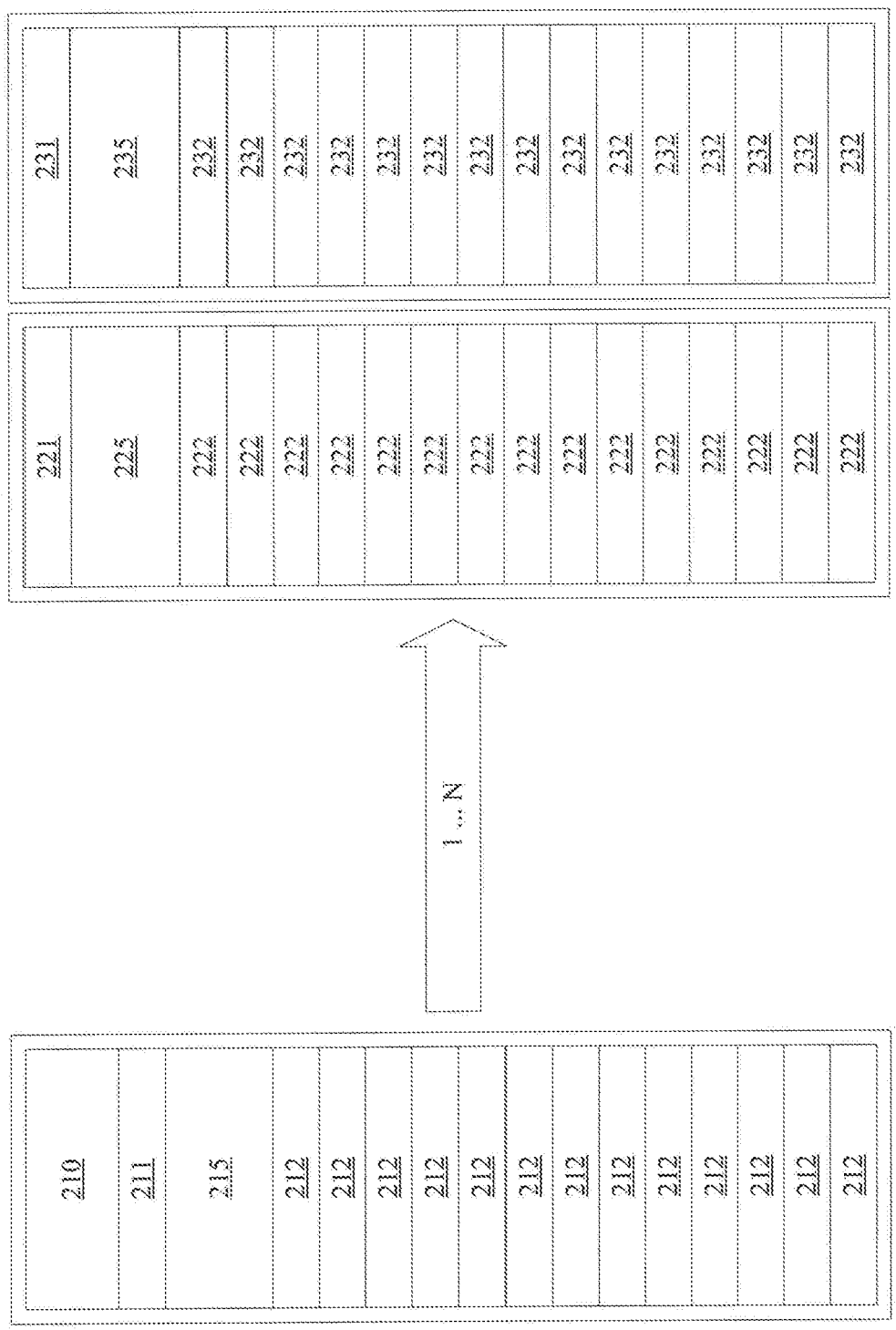
FIG. 2B illustrates aspects of an Energy Storage Systems (ESS) Zone which are Alternating Current (AC) based for commissioning in accordance with various embodiments of this disclosure.

FIG. 2B illustrates aspects of an Energy Storage Systems (ESS) Zone which are AC based for commissioning in accordance with various embodiments of this disclosure. An ESS Zone master rack 200 and a plurality of AC based ESS systems within an ESS Zone 203, 204 can be connected to form an ESS Zone. Each ESS Zone contains one ESS Zone master rack 200. An ESS Zone master rack 200 may contain a system level controller module 210, a power conversion module 211, a BMS 215, and one or more battery modules 212. Other ESS within the ESS Zone 203, 204 which are AC based technology may only contain a power conversion module 221, 231, BMS 225, 235, and one or more battery modules 222, 232.

FIG. 2C illustrates aspects of an Energy Storage Systems (ESS) Zone which are DC based for commissioning in accordance with various embodiments of this disclosure. An ESS Zone master rack 200 and a plurality of AC based ESS 205, 206 can be connected to form an ESS Zone. An ESS Zone master rack 200 may contain a system level controller module 210, a power conversion module 211, a BMS 215, and one or more battery modules 212. Other ESS within the ESS Zone 203, 204 which are DC based technology may only contain a BMS 225, 235, and one or more battery modules 222, 232.

Figure 3A:
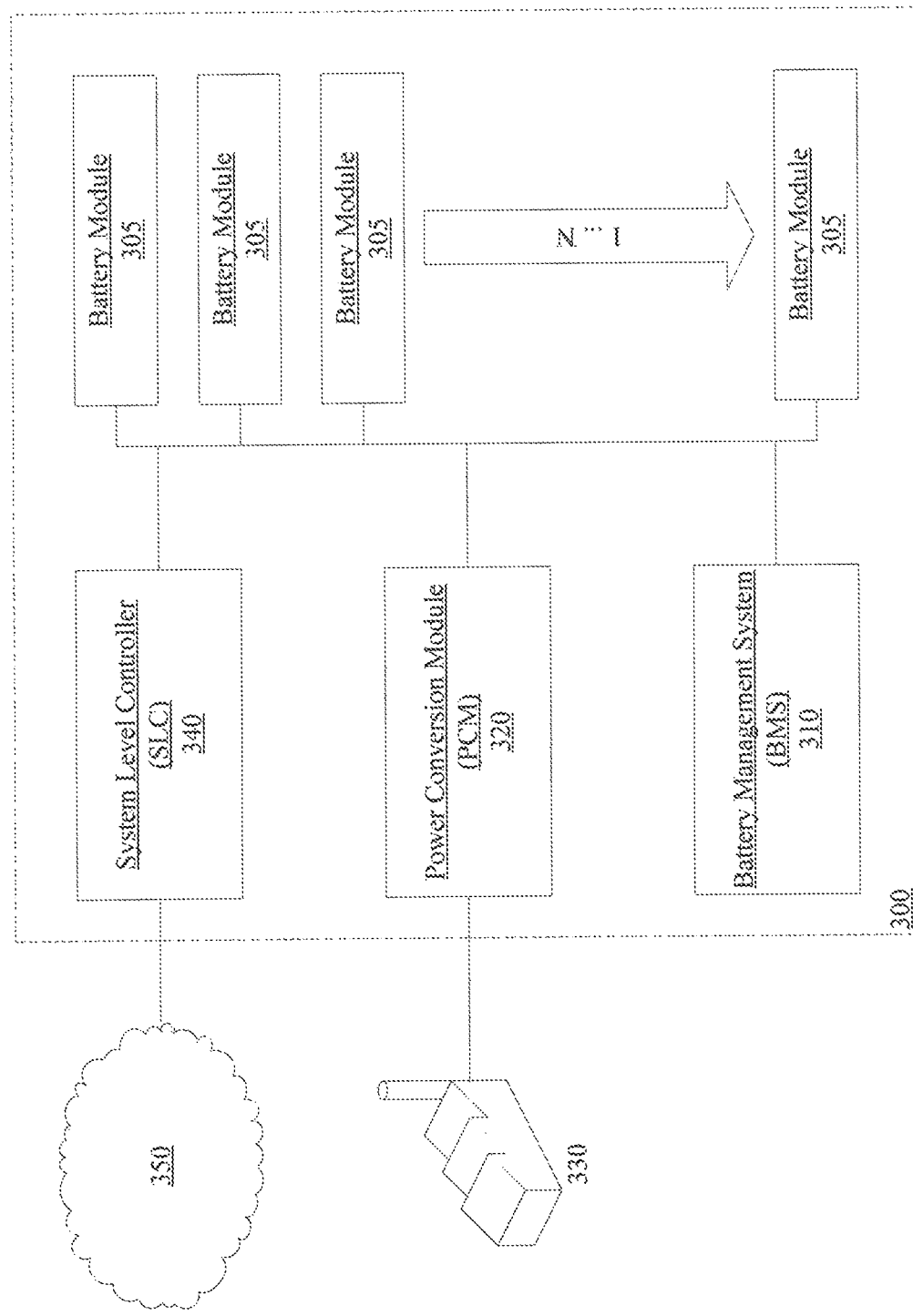
FIG. 3A illustrates a block diagram detailing aspects of an Energy Storage System (ESS) for commissioning in accordance with various embodiments of this disclosure.

FIG. 3A illustrates a block diagram detailing aspects of an Energy Storage System (ESS) for commissioning in accordance with various embodiments of this disclosure. Embodiments of an ESS 300 may include a combination of the elements detailed above. It should be appreciated these elements share a variety of interfaces including, but not limited to, physical, power, and data, each figure illustrates a simplification of these connections.

Each battery module 305 may contain not only battery cells to store energy, but also a battery controller to provide management and control over the cells in each module and serve to manage and monitor the battery contactors responsible in part to open and/or close a series of relays or similar devices to apply or remove electrical power from the battery cells.

A battery management system 310 may be used at the ESS 300 level to monitor and manage the battery modules 305 within the ESS 300 to provide status information and other appropriate control to achieve the benefits of safe, reliable, and longevity of the battery modules 305. A battery management system 310 may comprise of a controller, electromechanical switches, power supplies, and/or sensors to monitor voltage, current, and/or power at the ESS 300 level.

A power conversion module 320 may be a bi-directional converter which controls the energy flow between the battery modules 305 and a utility source 330. While the ESS 300 is discharging any stored energy, any battery DC voltage may be converted into a 3-phase voltage output. While recharging, the power conversation module 320 accepts utility power and converts it into DC voltage to charge the battery modules 305. Embodiments also contemplate the acceptance of direct DC voltage while recharging.

Embodiments in the disclosure contemplate that a utility source 330 may be a power utility, examples of which may include a grid utility which provides AC power via an established distributed power network. Examples of other AC sources may include AC generators either on station or remotely located. Various DC sources are also contemplated by the disclosure including other battery arrays connected to the ESS 300, or any type of renewable supply such as solar arrays, wind turbines, and/or kinetic energy sources. It should be appreciated this disclosure is not limited by the number or type of utility sources provides to the ESS 300.

A system level controller 340 provides the data connection to sources external to the ESS 300. While the system level controller 340 is illustrated in FIG. 3A to have a connection with a cloud computing environment 350, a local connection to a data source may be utilized.

Embodiments also contemplate no connection to the system level controller 340 as autonomous control within the ESS 300 is viable. It should also be appreciated any data generated by the ESS 300 may be used in furtherance of the benefits for the ESS 300 and may be collected, aggregated, and further processed and transmitted back to the ESS 300 to alter the operational parameters to create alternate embodiments of this disclosure.

A data connection from the system level controller 340 may take many forms. Examples include, but are not limited to, access to the cloud computing environment 350 may also be gained by a variety of devices capable of connecting to such an environment in either a wired or wireless connection manner. These wired connection types may include, but are not limited to any physical cabling method such as category 5e cable, coaxial, fiber, or any other physical media to propagate electrical signals. Wireless connections may include, but are not limited to Personal Area Networks (PAN), Local Area Networks (LAN), Wi-Fi, Bluetooth, cellular, global, or space based communication networks. It is well understood that computing devices and connection types are intended to be illustrative only and that computing nodes and cloud computing environments can communicate with any type of computerized device over any type of network with addressable or direct connections.

Figure 3B:
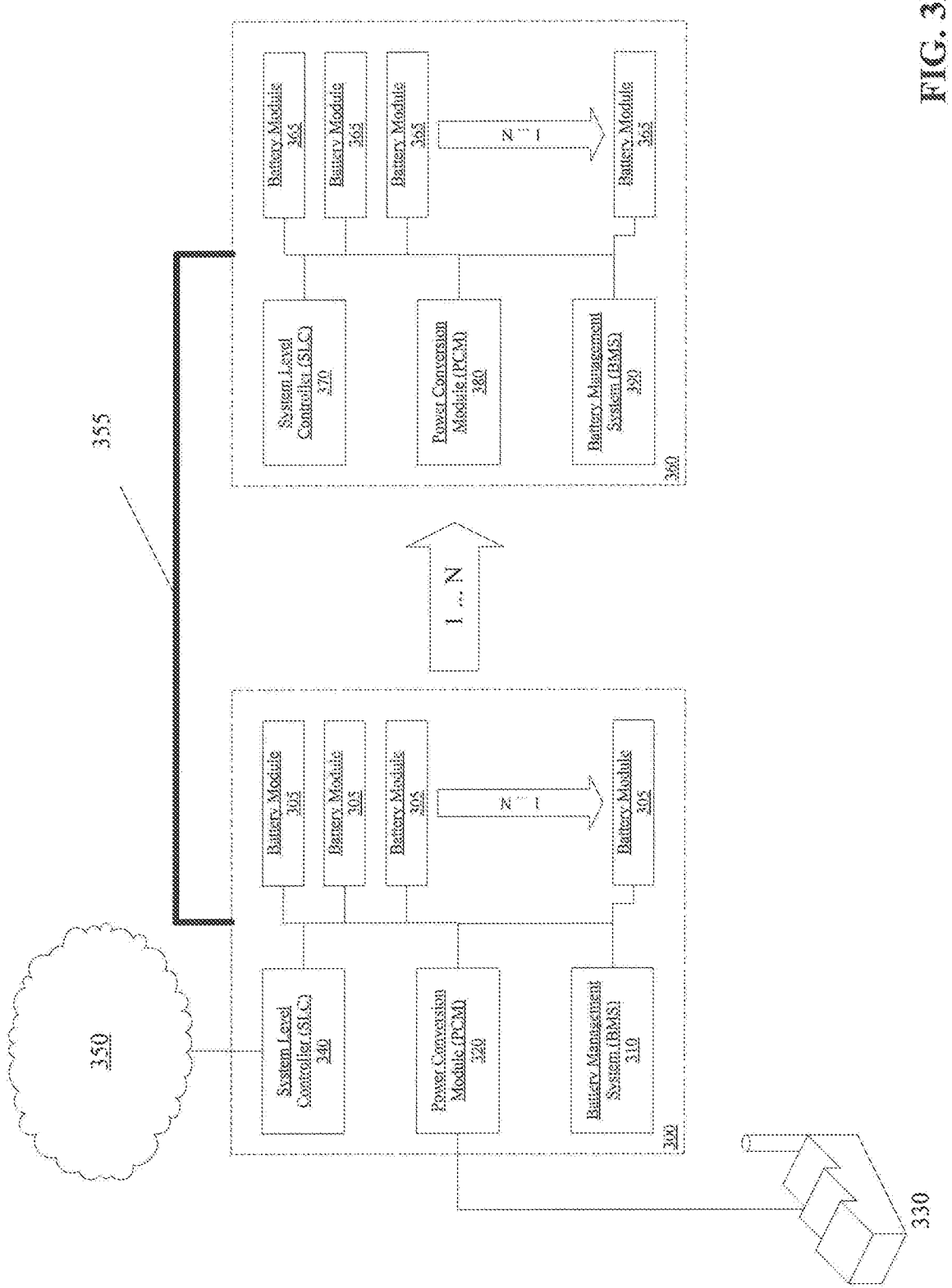
FIG. 3B illustrates a block diagram detailing aspects of a plurality of an Energy Storage System (ESS) for commissioning in accordance with various embodiments of this disclosure.

FIG. 3B illustrates a block diagram detailing aspects of a plurality of an ESS for commissioning in accordance with various embodiments of this disclosure. An ESS 300 is illustrated with the components detailed above in reference to FIG. 3A. A second ESS 360 is illustrated with one or more battery modules 365, system level controller 370, power conversion module 380, and battery management system 390 as described above. It should be appreciated that not every component in one ESS need be replicated in subordinate ESSs. Further, this disclosure contemplates the connection 355 of ESSs as illustrated in FIG. 3B. This connection, may be a connection for power, data, and/or any other purpose. Such a connection may be of a hybrid type and serve many types of connections between ESSs.

FIG. 4A illustrates a block diagram detailing aspects of energy storage strings of an Energy Storage System (ESS) in accordance with various embodiments of this disclosure. An energy storage string may be an element in an ESS. One or more energy strings may be present as part of an ESS. In a first ESS, an energy storage string may contain an energy source 405, battery management system 410, and any number (e.g., 1 to N) of battery modules 420, 430. Each battery module may also comprise a battery control module 422, 432 as well as one or more battery cells 424, 426, 428, 434, 436, 438.

An energy source 405 may be any stored or live energy source able to be processed by a battery management system 410, as described above, and/or battery module 420, 430. Embodiments of an energy source 405 may include, but are not limited to, AC power from a live source, for example an electrical outlet, or generated source. Various voltages, frequencies, power factors are contemplated. One or more batteries of various chemistries such as lead acid, lithium ion, and/or zinc carbon are also contemplated in this disclosure as an energy source 405. Both primary and rechargeable battery types are contemplated in this disclosure as well as physical size, voltage, current, amp hour, power, and other electrical characteristics. It is well understood that electrical distribution, generated electricity, and battery technologies are intended to be illustrative only and no limitations are implied in this disclosure.

Each battery module 420, 430 may consist of a battery control module 422, 432 and/or one or more battery cells 424, 426, 428, 434, 436, 438. A battery control module 422, 432 may be associated with one or more battery cells 424, 426, 428, 434, 436, 438 and utilized to measure, monitor, and manage the battery cells 424, 426, 428, 434, 436, 438 during their operation. This may include, but is not limited to, controlling a battery contactor, limit operation within particular operational parameters, calculating operating metric data, security authentication, load balancing, reporting data, monitoring heath metrics such as voltage, current, power, temperature, humidity, and/or other parameters beneficial to determining the state of the one or more battery cells 424, 426, 428, 434, 436, 438.

In one embodiment, a battery management system 410 may operate with multiple battery control modules 422, 432 to measure, monitor, and/or manage one or more battery modules 420, 430, each of which may also be called a "battery string." One or more battery strings are contemplated within an ESS with one or more battery cells 424, 426, 428, 434, 436, 438 within each battery string.

Embodiments of a battery cell 424, 426, 428, 434, 436, 438 may include, one or more batteries of various chemistries such as lead acid, lithium ion, and/or zinc carbon. Both primary and rechargeable battery types are contemplated in this disclosure as well as physical size, voltage, current, amp hour, power, and other electrical characteristics. It is well understood that battery technologies are intended to be illustrative only and no limitations are implied in this disclosure.

Figure 4B:
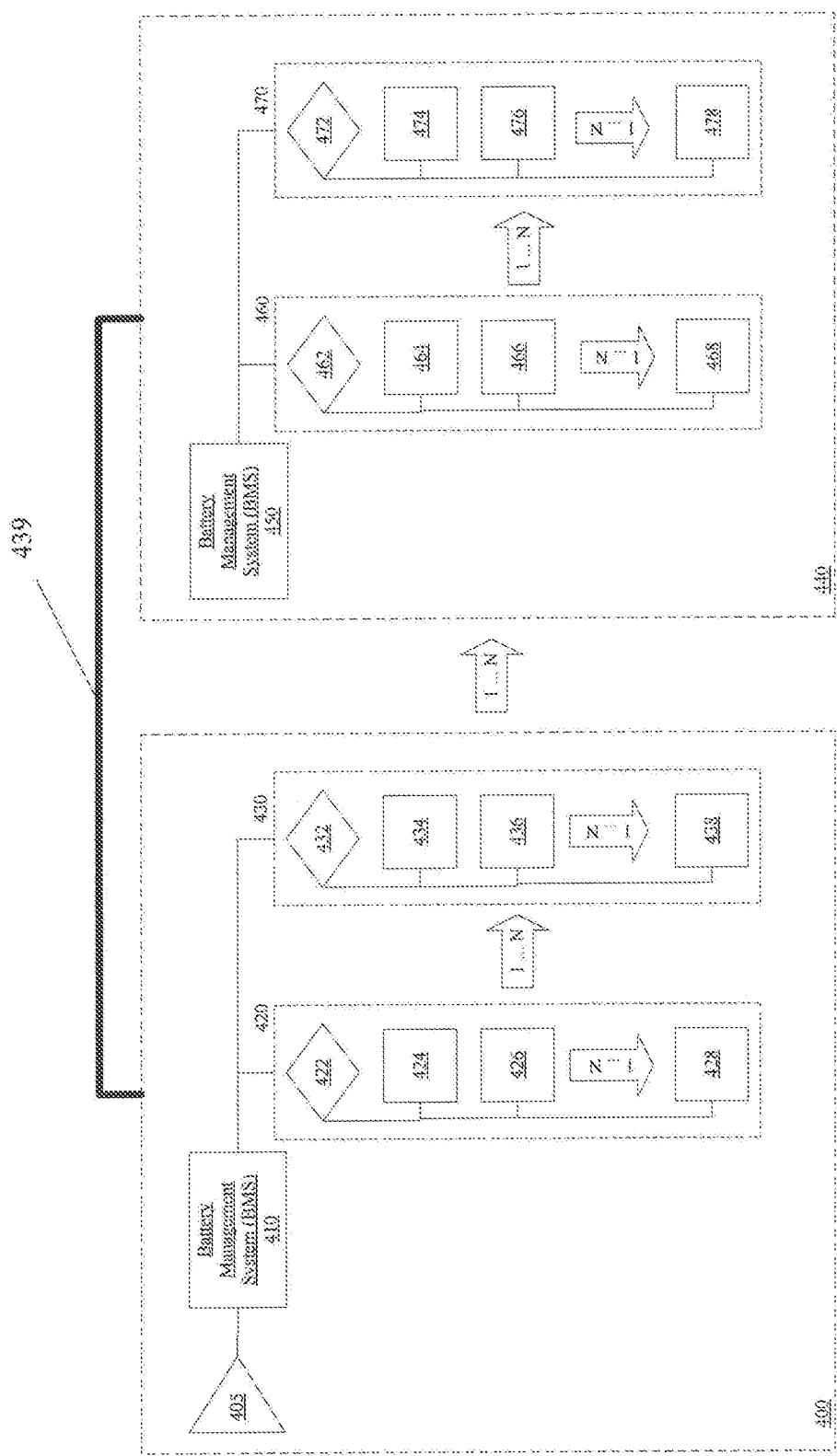
FIG. 4B illustrates a block diagram detailing aspects of a plurality of energy storage strings from a plurality of Energy Storage Systems (ESS) in accordance with various embodiments of this disclosure.

FIG. 4B illustrates a block diagram detailing aspects of a plurality of energy storage strings from a plurality of Energy Storage Systems (ESS) in accordance with various embodiments of this disclosure. Embodiments of a first ESS 400 are illustrated with the components detailed above. Embodiments of a second ESS 440 are illustrated with one or more, battery management system 450, battery control modules 462, 472 battery modules 460, 470, and battery cells 464, 466, 468, 474, 476, 478 as described above. It should be appreciated that not every component in one ESS need be replicated in subordinate ESSs. Further, this disclosure contemplates the connection 439 of ESSs as illustrated in FIG. 4B. This connection, may be a connection for power, data, and/or any other purpose. Such a connection may be of a hybrid type and serve many types of connections between ESSs.

Figure 5A:
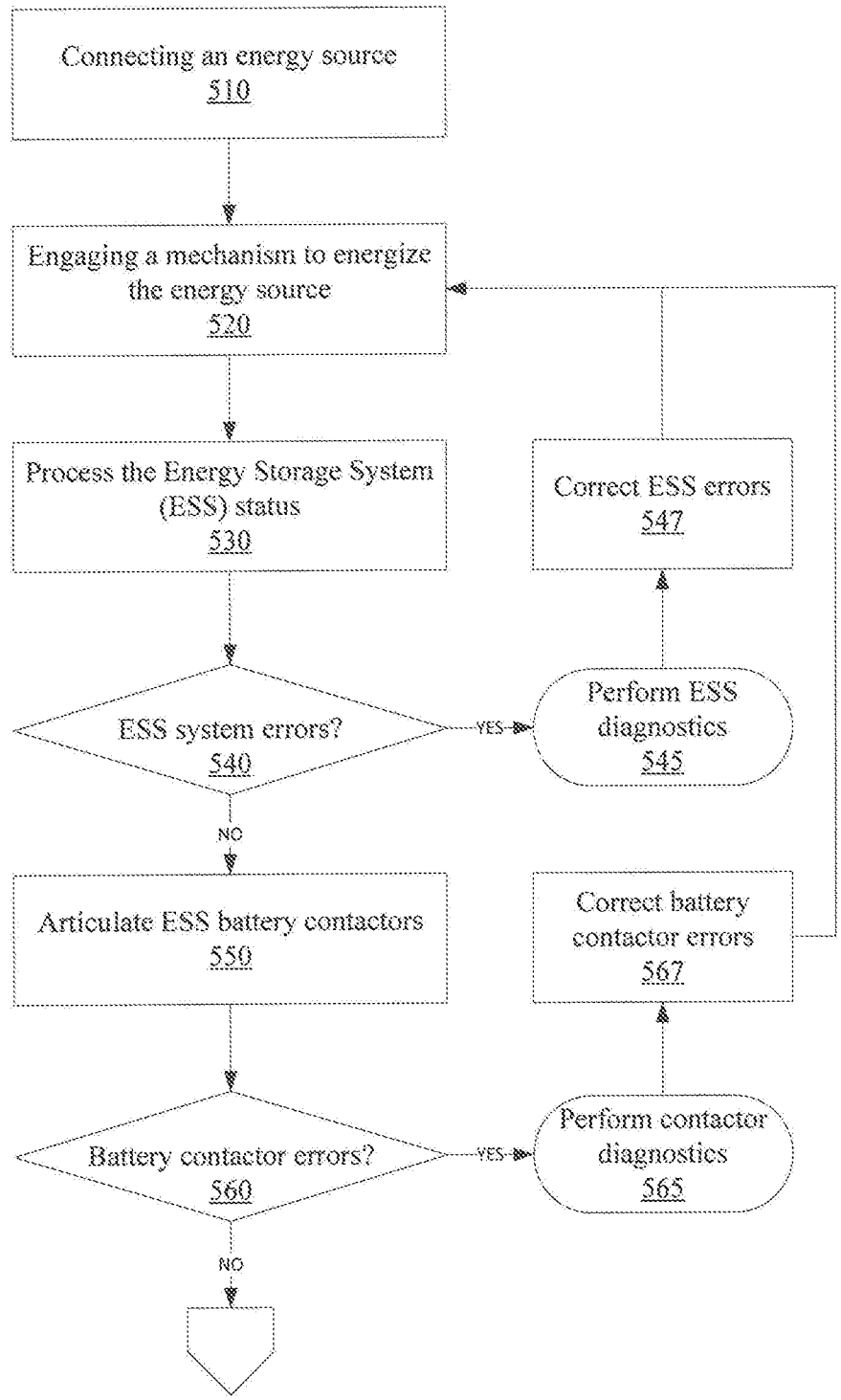
FIG. 5A illustrates a flow diagram detailing aspects of a commissioning method for a single Energy Storage System (ESS) in accordance with various embodiments of this disclosure.

FIG. 5A illustrates a flow diagram detailing aspects of a commissioning method for an Energy Storage System (ESS) in accordance with various embodiments of this disclosure such as FIG. 1. Embodiments of a commissioning method may include transforming an ESS from a non-operational state, to an operational state when an ESS has been safely transported from one location to another which generally requires any battery modules to be disconnected from the remainder of the ESS to prevent an energy discharge.

Commissioning of an ESS may be initiated with the connection of an energy source to an ESS at block 510. Types of energy sources are described above and include live energy sources such as energy available from an electrical outlet, for example from a utility source, or a locally generated source, and/or stored energy sources such as batteries, capacitors, and/or other potential and/or kinetic energy storage source. Energy from the source may be transformed from AC to DC, or DC to AC, and/or transformed in voltage, current, frequency, power factor, or other parametric value. An energy source may be part of the ESS and/or introduced to the ESS upon commissioning time. It should be appreciated that no one type of energy source is required to commission an ESS, only that any type of energy source listed herein, and substitutes not listed, may be used.

Once an energy source is connected at block 510, it may be activated by a user and/or system. In some embodiments, a user may engage a mechanism to energize the energy source such as a switch, relay, contact, keyway, lock, and/or other device to create a contact between the energy source and the various processing modules within the ESS at block 520. Alternatively, this disclosure contemplates the use of autonomous methods, such as computer controlled methods, such that a command may be given via a software interface to engage a mechanism to energize the energy source at block 520. No limitations are implied as to the type and scope of the controlling autonomous method, which are multitudinous in the art, only that such a method to engage a mechanism to energize the energy source at block 520 is contemplated as part of this disclosure.

Once energy is applied, the ESS will process status to determine the current state of the ESS at block 530. This processing may occur at a system level controller, power conversion module, one or more battery modules, and/or a battery management system, within a single ESS or a Zone ESS. The ESS status may include, but is not limited to, hardware status, software status, battery module status, and/or any other status or information indicative of the overall health of the ESS. This ESS status is processed by the ESS to determine if any ESS errors exist at decision block 540. These errors may include hardware, software, or interconnection errors from any ESS component or combination thereof including, but not limited to, battery module system, power conversion module, system level controller, battery module, and/or any system and/or sub-system.

If an error is detected, ESS diagnostics may be performed at block 545 to determine the error condition. ESS diagnostics may determine one or more error condition(s) and/or one or more possible recommended actions to remedy the error condition(s). It should be appreciated the diagnostics and recommended actions may be derived from one or more of the systems and/or sub-systems of the ESS and no one processing module may be responsible for all diagnostics and/or recommended actions. Issues detected in the ESS are corrected at block 547 by manual intervention, for example a user resetting a breaker on the ESS, or autonomously, for example a software program commands a breaker on the ESS to reset. Once completed, the mechanism to engage the energy source is again engaged at block 520.

If there are no ESS system errors at decision block 540, battery control modules may then control battery contactors in each battery module to open or close the electrical contacts to the battery cells at block 550 to cease or allow energy to flow to the systems and/or sub-systems of the ESS. It should be appreciated articulation of the battery contactors at block 550 may occur simultaneously in all battery modules, or may occur in a method whereby a small number of battery contactors are energized and the ESS allowed to achieve a quiescent state, followed by other battery contactors being energized. Other embodiments are contemplated such as a sequenced start of battery contactors and modules to balance power, voltage, and/or current and allow an orderly commissioning of the ESS. It should be appreciated various embodiments are contemplated as to the number, sequence, and/or timing to control the battery contactors at block 550 to achieve such benefits as safety, robust operations, and/or specific needs of a particular application.

As the battery contactors are controlled, an error status on the contactors is examined to determine if there are any battery contactor errors at decision block 560. This error status may include, but is not limited to, a "stuck" battery contactor that was requested, but did not, change state, a contactor that is not in an expected position, and/or that is responding with a loss of communication. Other contactor errors may exist and are contemplated as part of this disclosure.

If an error in the battery contactors is detected at decision block 560, diagnostics on the battery contactors may be performed at block 565 to determine the error condition. Battery contactor diagnostics may determine one or more error condition(s) and/or one or more possible recommended actions for remedying the error condition(s). It should be appreciated the diagnostics and recommended actions may be derived from one or more of the systems and/or sub-systems of the ESS and no one processing module may be responsible for all diagnostics and/or recommended actions. Issues detected in the battery contactors may be corrected at block 567 by manual intervention, for example re-seating a battery module on the ESS, or autonomously, for example a software program commands a battery contactor on the ESS to reset. Once completed, the mechanism to energize the energy source at block 520 is again engaged.

Figure 5B:
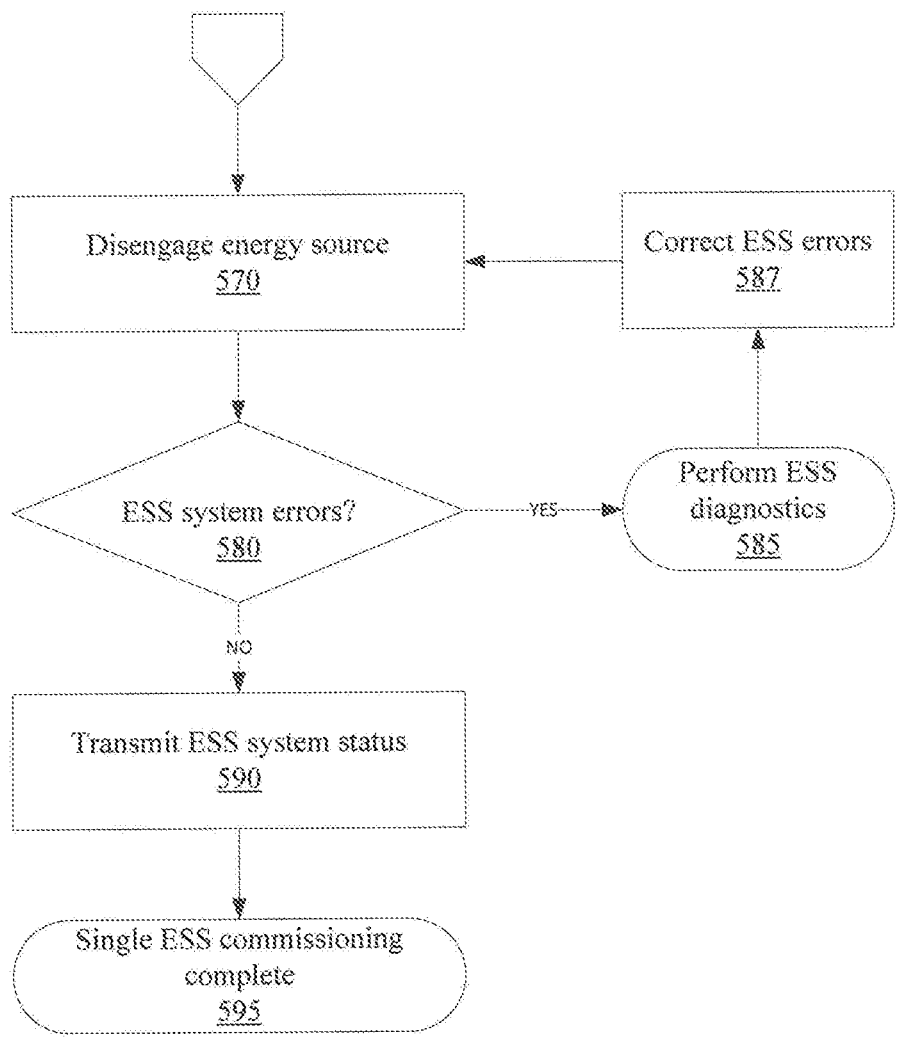
FIG. 5B illustrates a flow diagram detailing aspects of a commissioning method for a single Energy Storage System (ESS) continued from FIG. 5A.

FIG. 5B illustrates a flow diagram detailing aspects of a commissioning method for an Energy Storage System (ESS) continued from FIG. 5A. Once the battery contactors in the battery modules are controlled and any stored energy is flowing from the battery modules to the ESS without any battery contactor errors being detected at decision block 560, the energy source may be disengaged at block 570. Once disengaged, the ESS will determine if any errors exist at decision block 580 as detailed above and if detected, ESS diagnostics may be performed at block 585 to determine the error condition as detailed above. Issues detected in the ESS are corrected at block 587 by manual intervention, for example a user resetting a breaker on the ESS, or autonomously, for example a software program commands a breaker on the ESS to reset. Once completed, the energy source is again disengaged at block 570. It should be appreciated other remediation is contemplated as part of this disclosure including, but not limited to, a complete reset of the ESS and/or a combination of system and/or subsystems that comprise the ESS.

If there are no ESS system errors at decision block 580, a status of the ESS is processed and transmitted at block 590 to a user or other management interface. The status of the ESS may include general status of the ESS, health information of the battery modules, and/or communication status of the various systems and/or subsystems of the ESS. This status data may be further transmitted to a cloud environment and collected, collated, and/or further processed to produce actionable data on characteristics of the subject ESS or the application the ESS is deployed into. As one of many examples, if an ESS is utilized in a grid stabilization application, data regarding discharge of batteries may be used as correlative data as to power quality of the grid the ESS is servicing. Further, subsequent recharge rates over time may be correlated to demonstrate and calculate lifespan characteristics of the battery modules in the particular ESS and also may serve as guidelines for other such battery modules in similar applications. In this way, an ESS may serve to produce data which exceeds documented specification data for some modules within the ESS.

Once a status of the ESS is transmitted at block 590 and the battery modules associated with the ESS are providing energy to the ESS, the commissioning is complete for the single ESS at block 595.

Figure 6A:
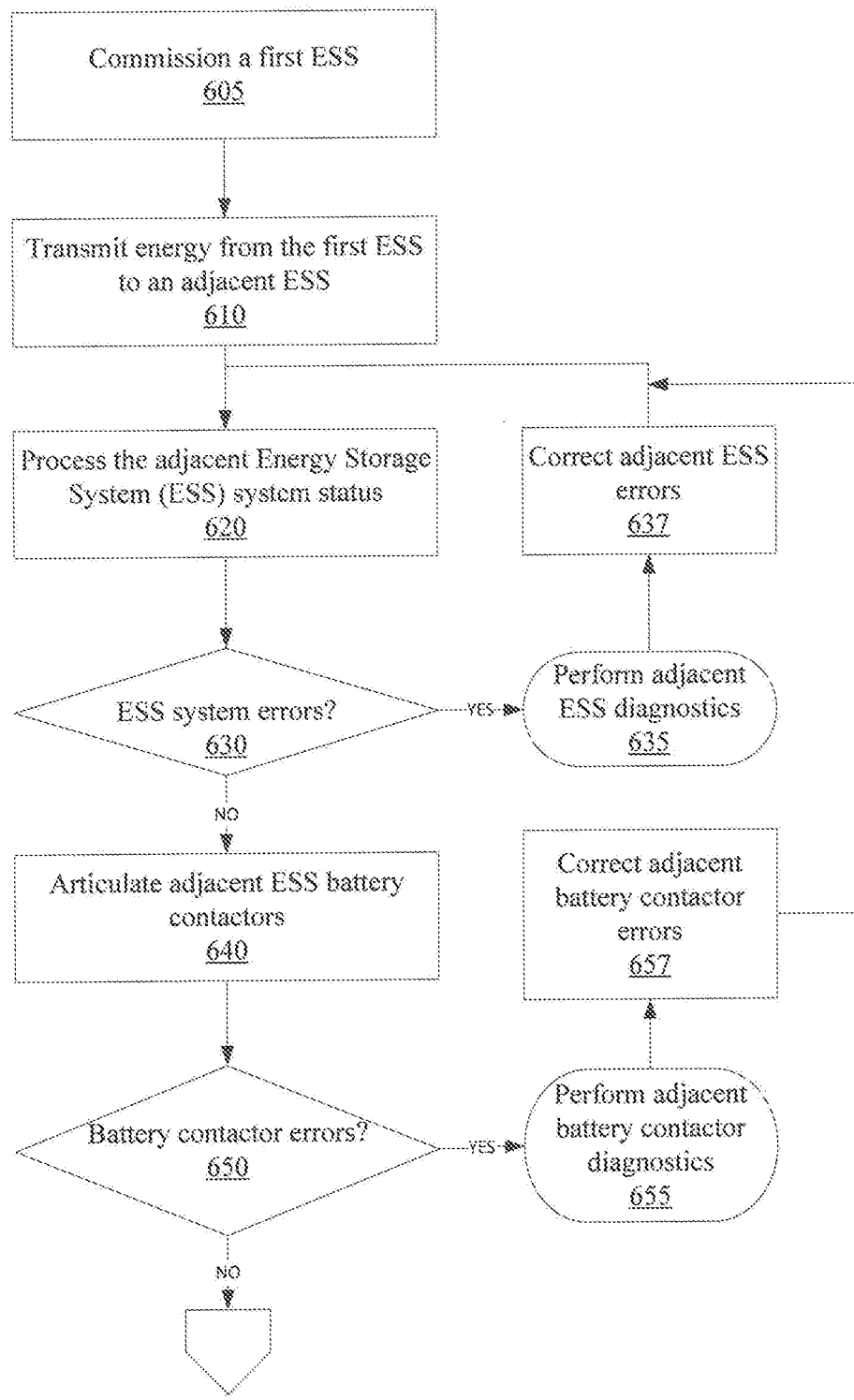
FIG. 6A illustrates a flow diagram detailing aspects of a commissioning method for a plurality of Energy Storage System (ESS) in accordance with various embodiments of this disclosure.

FIG. 6A illustrates a flow diagram detailing aspects of a commissioning method for a plurality of Energy Storage System (ESS) in accordance with various embodiments of this disclosure such as FIG. 2A. It should be appreciated the commissioning of a plurality of ESS may require only an energy source 405 to commence the commissioning process of the first ESS at block 605 and the energy produced from a first ESS is transmitted to a subordinate ESS at block 610 for their commissioning.

Once energy is applied to the subordinate ESS, the subordinate ESS will process its system status at block 620 to determine the current state of the subordinate ESS. As with other ESS status, this may include, but is not limited to, hardware status, software status, battery module status, and/or overall health of the ESS. This subordinate ESS status is processed to determine if any ESS errors exist at decision block 630. These errors may include hardware, software, or interconnection errors from any ESS component or combination thereof including, but not limited to, battery module system, power conversion module, system level controller, battery module, and/or any system and/or sub-system.

If an error is detected at decision block 630, ESS diagnostics may be performed on the subordinate ESS at block 635 to determine the error condition. ESS diagnostics may determine one or more error condition(s) and/or one or more possible recommended actions for remedying the error condition(s). It should be appreciated the diagnostics and recommended actions may be derived from one or more of the systems and/or sub-systems of the subordinate ESS and no one processing module may be responsible for all diagnostics and/or recommended actions. Issues detected in the subordinate ESS are corrected at block 637 by manual intervention, for example a user resetting a breaker on the ESS, or autonomously, for example a software program commands a breaker on the ESS to reset. Once completed, processing the subordinate ESS status is again performed at block 620.

If no system errors are determined at decision block 630, battery control modules may then control battery contactors in each battery module to open or close the electrical contacts to the battery cells at block 640 to cease or allow energy to flow to the systems and/or sub-systems of the current ESS. It should be appreciated articulation of the battery contactors at block 640 may occur simultaneously in all battery modules, or may occur in a method whereby a small number of battery contactors are energized and the ESS allowed to achieve a quiescent state, followed by other battery contactors being energized. Other embodiments are contemplated such as a sequenced start of battery contactors and modules to balance power, voltage, and/or current and allow an orderly commissioning of the ESS. It should be appreciated various embodiments are contemplated as to the number, sequence, and/or timing to control the battery contactors at block 640 to achieve such benefits as safety, robust operations, and/or specific needs of a particular application.

As the battery contactors are controlled, an error status on the contactors is examined to determine any battery contactor errors at decision block 650. The battery contactor error status may include, but is not limited to, a "stuck" battery contactor that was requested, but did not, change state, a contactor that is not in an expected position, and/or that is responding with a loss of communication. Other contactor errors may exist and are contemplated as part of this disclosure.

If an error in the battery contactors is detected at decision block 650, diagnostics on the battery contactors may be performed at block 655 to determine the error condition. Battery contactor diagnostics may determine one or more error condition(s) and/or one or more possible recommended actions. It should be appreciated the diagnostics and recommended actions may be derived from one or more of the systems and/or sub-systems of the ESS and no one processing module may be responsible for all diagnostics and/or recommended actions. Issues detected in the battery contactors may be corrected at block 657 by manual intervention, for example re-seating a battery module on the subordinate ESS, or autonomously, for example a software program commands a battery contactor on the subordinate ESS to reset. Once completed, processing the subordinate ESS status is again performed at block 620.

Figure 6B:
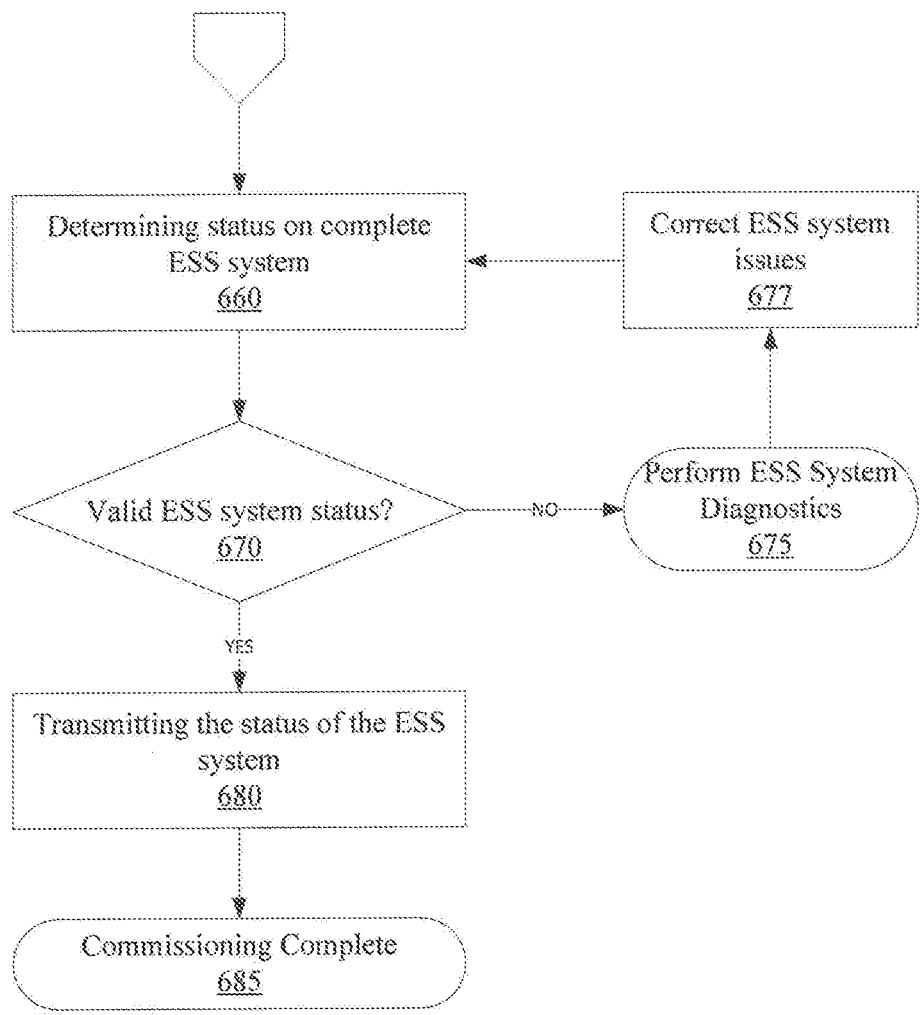
FIG. 6B illustrates a flow diagram detailing aspects of a commissioning method for a plurality of Energy Storage System (ESS) continued from FIG. 6A.

FIG. 6B illustrates a flow diagram detailing aspects of a commissioning method for a plurality of Energy Storage System (ESS) continued from FIG. 6A. Once the battery contactors in the battery modules are controlled and with no battery contactor errors determined at block, any stored energy is flowing from the battery modules to the subordinate ESS, the ESS will determine 660 if any errors exist at decision block 670 as detailed above and if detected, ESS diagnostics may be performed at block 675 to determine the error condition as detailed above. Issues detected in the ESS are corrected at block 677 by manual intervention, for example a user resetting a breaker on the ESS, or autonomously, for example a software program commands a breaker on the ESS to reset. Once completed, the status on the complete ESS is determined at block 660. It should be appreciated other remediation is contemplated as part of this disclosure including, but not limited to, a complete reset of the ESS and/or a combination of system and/or subsystems that comprise the ESS.

A status of the ESS is processed and transmitted at block 680 to a user or other management interface which may include general status or the ESS, health information of the battery modules, and/or communication status of the various systems and/or subsystems of the ESS. This status data may be further transmitted to a cloud environment and collected, collated, and/or further processed to produce actionable data on characteristics of the subject ESS or the application the ESS is deployed into. As one of many examples, if an ESS is utilized in a grid stabilization application, data regarding discharge of batteries may be used as correlative data as to power quality of the grid the ESS is servicing. Further, subsequent recharge rates over time may be correlated to demonstrate and calculate lifespan characteristics of the battery modules in the particular ESS and also may serve as guidelines for other such battery modules in similar applications. In this way, an ESS may serve to produce data which exceeds documented specification data for some modules within the ESS.

Once a status of the ESS is transmitted at block 680 and the battery modules associated with the ESS are providing energy to the ESS, the commissioning is complete for the ESS Zone master single ESS at block 685. It should be appreciated principles of the disclosure contemplate subordinate ESS start up sequences that may begin with an ESS subordinate to a first ESS which is providing energy for subsequent ESS commissioning, or for example, start up sequences which do not commission particular ESS systems, but battery modules across several subordinate ESS modules simultaneously.

Figure 7:
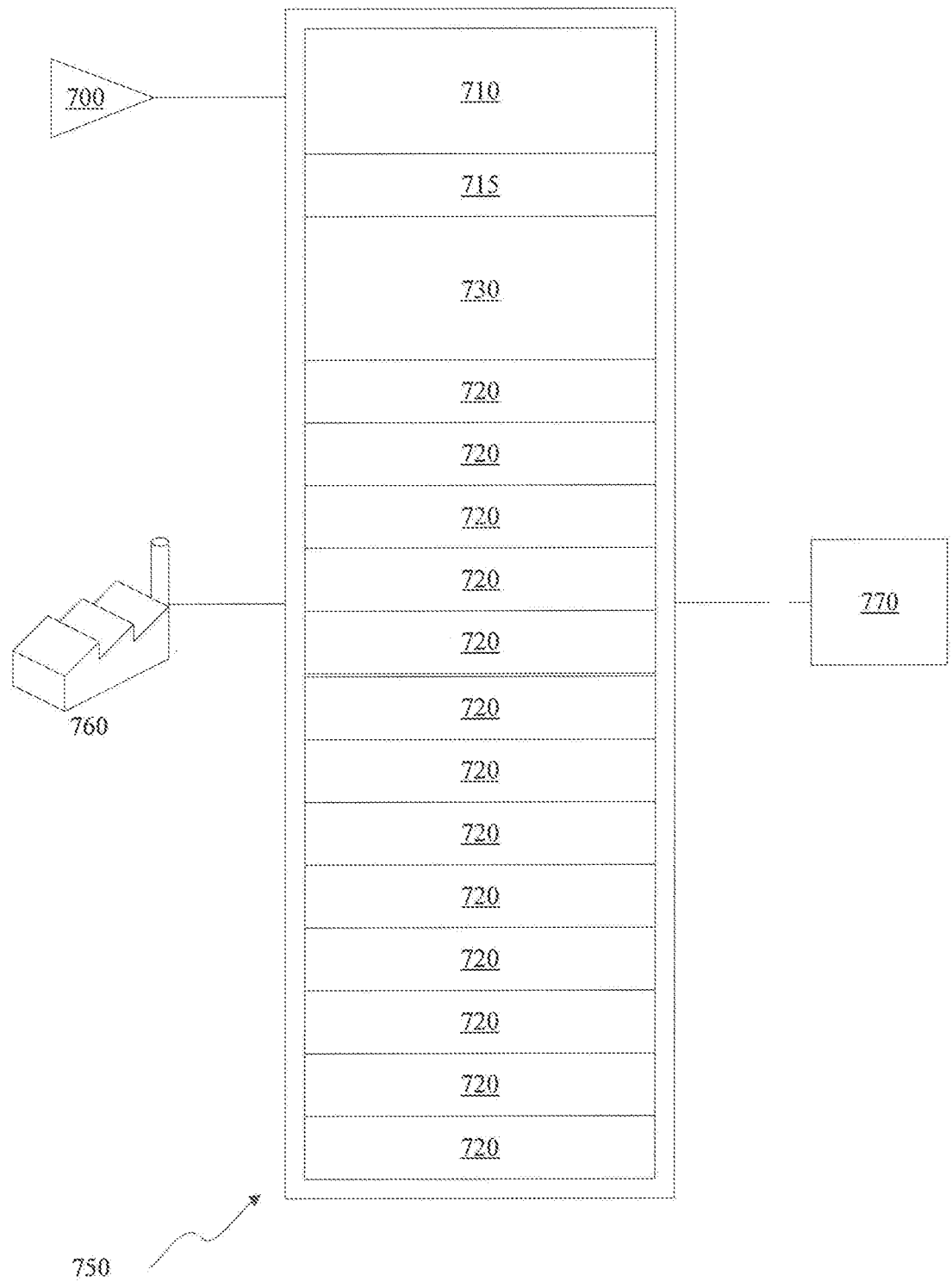
FIG. 7 illustrates various aspects of examples for use in commissioning a single Energy Storage System (ESS) in accordance with various embodiments of this disclosure.

FIG. 7 illustrates various aspects of examples for use in commissioning an Energy Storage System (ESS) in accordance with various embodiments of this disclosure. An ESS 750 is illustrated with a system level controller 710, power conversion module 715, BMS 730 and a plurality of battery cells 720. As one of various examples, the ESS 750 may be connected to a utility source 760 to charge the ESS 750 battery cells 720 or alternately to provide power to a load such as a data center 770. It should be appreciated in various examples, a utility source 760 is not required to support a load such as a data center 770.

In operation a user, to commission the ESS 750, would generally follow the flow in FIGS. 5A and 5B. An energy source 700 such as a lead acid battery would be connected to the ESS 750 and engaged to connect the energy source 700 to the ESS 750. If the ESS 750 starts without errors the battery contactors in each battery cell 720 would be controlled and absent any errors, the other battery modules of the ESS 750 would start up and allow the energy source 700 to be removed. At this time the ESS 750 is able to support its own operations and the associated data center 770 load.

Figure 8:
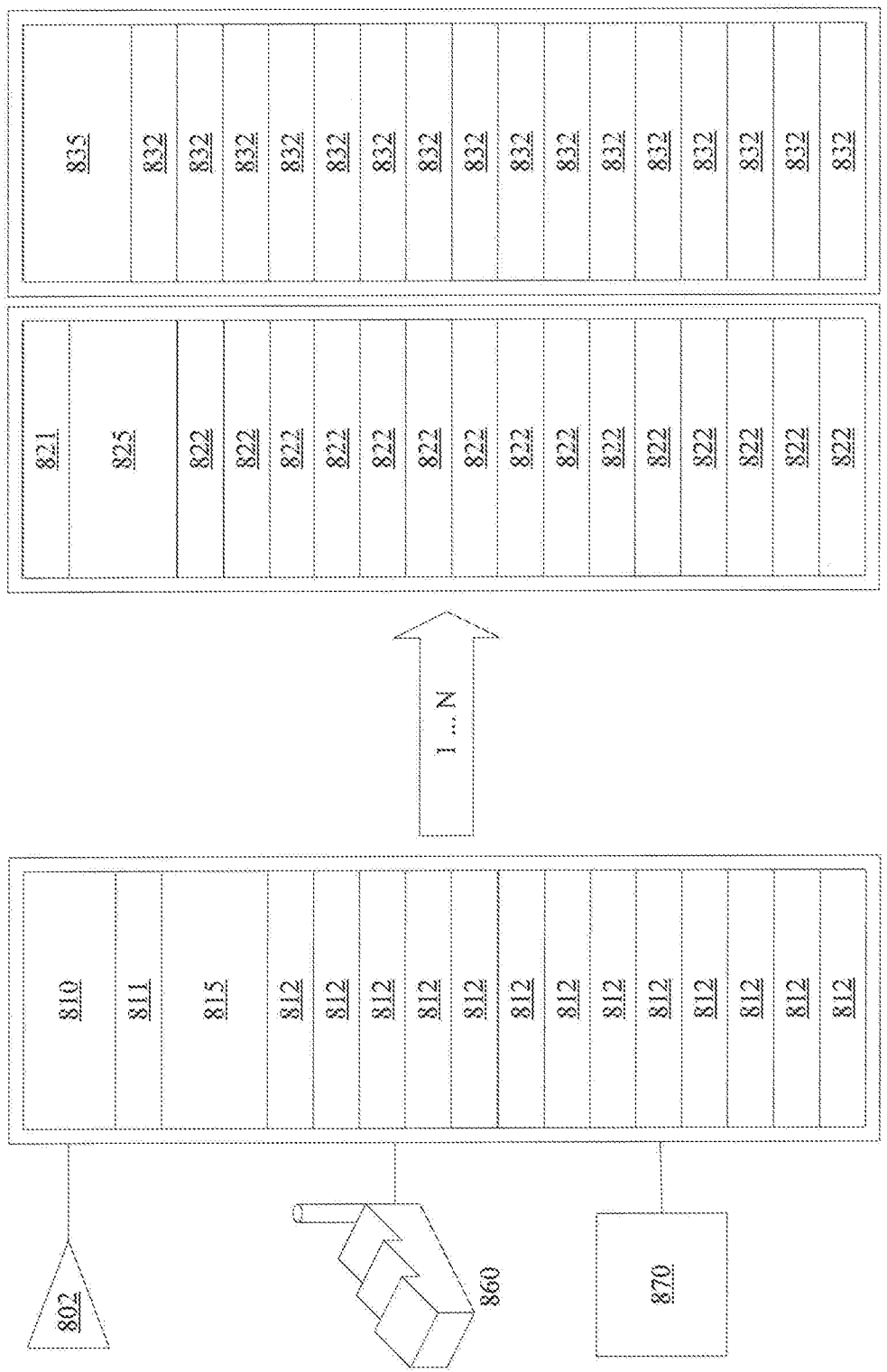
FIG. 8 illustrates various aspects of a hybrid Energy Storage Systems (ESS) Zone examples for use in commissioning a plurality of Energy Storage Systems (ESS) in accordance with various embodiments of this disclosure.

FIG. 8 illustrates various aspects of a hybrid Energy Storage Systems (ESS) Zone examples for use in commissioning a plurality of Energy Storage Systems (ESS) in accordance with various embodiments of this disclosure. An ESS Zone 850 is illustrated with a plurality of ESS racks including a master rack 800 containing a system level controller 810, power conversion module 811, BMS 815, and a plurality of battery cells 812. An AC based ESS rack 803 includes a power conversion module 821, BMS 825 and a plurality of battery cells 822. A DC based ESS rack 804 includes a BMS 835 and a plurality of battery cells 832.

As one of various examples the ESS Zone 850 may be connected to a utility source 860 to charge the ESS Zone 850 battery cells 812, 822, 832 or alternately to provide power to a load such as a data center 870. It should be appreciated in various examples, a utility source 860 is not required to support a load such as a data center 870.

In operation a user to commission the ESS Zone 850 would generally follow the flow in FIGS. 6A and 6B. An energy source 802 such as a lead acid battery would be connected to the ESS Zone 850 and engaged to connect the energy source 802 to the ESS Zone 850. If the ESS Zone 850 starts without errors the battery contactors in each battery cell 812, 822, 832 would be controlled and absent any errors, the remainder of the ESS Zone 850 would start up and allow the energy source 802 to be removed. At this time the ESS Zone 850 is able to support its own operations and the associated data center 870 load.

In embodiments of the present disclosure discussed above, results of analyses are described as being provided in real-time. As understood by those skilled in the art, the use of the term real-time is not meant to suggest that the results are available immediately, but rather, are available quickly giving a designer the ability to try a number of different designs over a short period of time, such as a matter of minutes.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A method of commissioning an energy storage system, comprising:
   connecting a first energy storage system to a battery module;
   energizing, by the first energy storage system, the battery module;
   articulating one or more battery contactors within the first energy storage system to selectively couple the battery module to a power source;
   processing a battery contactor status of the one or more battery contactors to detect battery contactor errors;
   disengaging, responsive to not detecting any battery contactor errors, the battery module at the first energy storage system; and
   determining a status of the energy storage system.

2. The method of claim 1 further comprising processing an energy storage system status to detect one or more system errors.

3. The method of claim 2, further comprising correcting, autonomously in response to detecting the one or more system errors, the one or more system errors.

4. The method of claim 3, wherein correcting the one or more system errors includes commanding, autonomously in response to detecting the one or more system errors, a circuit breaker in the first energy storage system to reset.

5. The method of claim 2, wherein articulating the one or more battery contactors within the first energy storage system is performed responsive to not detecting one or more system errors.

6. The method of claim 1, wherein processing the battery contactor status of the one or more battery contactors to detect one or more battery contactor errors includes detecting at least one stuck battery contactor.

7. The method of claim 6, further comprising commanding, autonomously in response to detecting the at least one stuck battery contactor, the at least one stuck battery contactor to reset.

8. The method of claim 6, further comprising prompting, in response to detecting the at least one stuck battery contactor, a user to manually correct the at least one stuck battery contactor.

9. The method of claim 1, wherein energizing the battery module includes engaging a mechanism to couple the battery module to the first energy storage system.

10. The method of claim 9, wherein engaging the mechanism includes engaging one of a switch, a relay, a contact, and a keyway.

11. The method of claim 1 further comprising:
    transmitting energy from the first energy storage system to a subordinate energy storage system;
    processing an energy storage system status of the subordinate energy storage system utilizing a processing unit of the subordinate energy storage system;
    articulating one or more battery contactors within the subordinate energy storage system;
    processing a battery contactor status of the one or more battery contactors within the subordinate energy storage system utilizing the processing unit;
    determining a status of a plurality of energy storage systems; and
    transmitting the status of the plurality of energy storage systems to a processing unit of the first energy storage system.

12. An energy storage system comprising:
    at least one contactor configured to be coupled to at least one corresponding battery module;
    a power conversion module configured to be coupled to a power source at a first connection and the at least one battery module at a second connection; and
    a battery management system configured to be coupled to the at least one contactor and the power conversion module, and configured to:
    energize the at least one battery module;
    articulate the at least one contactor;
    process a contactor status of the at least one contactor to detect contactor errors;
    disengage the at least one battery module responsive to not detecting any battery contactor errors; and
    determine a status of the energy storage system.

13. The energy storage system of claim 12, wherein the battery management system is further configured to process an energy storage system status to detect one or more system errors.

14. The energy storage system of claim 13, wherein the battery management system is further configured to correct, autonomously in response to detecting the one or more system errors, the one or more system errors.

15. The energy storage system of claim 14, further comprising a circuit breaker, wherein the battery management system is further configured to command, autonomously in response to detecting the one or more system errors, the circuit breaker to reset.

16. The energy storage system of claim 13, wherein the battery management system is further configured to articulate the at least one contactor responsive to not detecting one or more system errors.

17. The energy storage system of claim 12, wherein processing the contactor status includes detecting at least one stuck battery contactor.

18. The energy storage system of claim 17, wherein the battery management system is further configured to command, autonomously in response to detecting the at least one stuck battery contactor, the at least one stuck battery contactor to reset.

19. The energy storage system of claim 12, wherein the battery management system is configured to engage a mechanism to couple the at least one battery module to the energy storage system.

20. The energy storage system of claim 12, further comprising a system level controller and at least one connection configured to be coupled to a subordinate energy storage system, and wherein the system level controller is configured to:
    transmit energy from the energy storage system to the subordinate energy storage system;

process an energy storage system status of the subordinate energy storage system;

articulate one or more battery contactors within the subordinate energy storage system;

process a battery contactor status of the one or more battery contactors within the subordinate energy storage system; and determine a status of a plurality of energy storage systems.

* * * * *